United States Patent
Soltz et al.

(10) Patent No.: US 7,394,067 B1
(45) Date of Patent: Jul. 1, 2008

(54) SYSTEMS AND METHODS FOR REDUCING ALTERATION OF A SPECIMEN DURING ANALYSIS FOR CHARGED PARTICLE BASED AND OTHER MEASUREMENT SYSTEMS

(75) Inventors: David Soltz, San Jose, CA (US); Paul Wieczorek, San Jose, CA (US); Aaron Zuo, Fremont, CA (US); Gabor Toth, San Jose, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 138 days.

(21) Appl. No.: 11/185,915

(22) Filed: Jul. 20, 2005

(51) Int. Cl.
*G01B 15/04* (2006.01)

(52) U.S. Cl. .................... 250/310; 250/492.2; 250/307; 250/306; 250/288; 118/725; 118/719; 438/758; 438/708; 216/62

(58) Field of Classification Search ............... None
See application file for complete search history.

(56) References Cited

U.S. PATENT DOCUMENTS

| | | | |
|---|---|---|---|
| 4,559,450 A | 12/1985 | Robinson et al. | |
| 4,766,313 A | * 8/1988 | Homma et al. ............ | 250/289 |
| 4,842,683 A | 6/1989 | Cheng et al. | |
| 5,215,619 A | 6/1993 | Cheng et al. | |
| 5,614,060 A | 3/1997 | Hanawa | |
| 5,740,226 A | 4/1998 | Komiya et al. | |
| 5,770,099 A | 6/1998 | Rice et al. | |
| 5,849,136 A | 12/1998 | Mintz et al. | |
| 5,882,165 A | 3/1999 | Maydan et al. | |
| 5,910,011 A | 6/1999 | Cruse | |
| 5,926,690 A | 7/1999 | Toprac et al. | |
| 5,976,310 A | 11/1999 | Levy | |
| 6,040,198 A | 3/2000 | Komiya et al. | |
| 6,072,147 A | 6/2000 | Koshiishi et al. | |
| 6,072,178 A | 6/2000 | Mizuno | |
| 6,074,518 A | 6/2000 | Imafuku et al. | |
| 6,083,363 A | 7/2000 | Ashtiani et al. | |
| 6,084,679 A | 7/2000 | Steffan et al. | |
| 6,089,181 A | 7/2000 | Suemasa et al. | |
| 6,110,287 A | 8/2000 | Arai et al. | |

(Continued)

FOREIGN PATENT DOCUMENTS

JP 08222175 8/1996

(Continued)

*Primary Examiner*—Jack I. Berman
*Assistant Examiner*—Zia Hashmi
(74) *Attorney, Agent, or Firm*—Baker & McKenzie LLP

(57) ABSTRACT

Systems and methods for reducing alteration of a specimen during by charged particle based and other measurements systems are provided. One system configured to reduce alteration of a specimen during analysis includes a vacuum chamber in which the specimen is disposed during the analysis and an element disposed within the vacuum chamber. A surface of the element is cooled such that molecules in the vacuum chamber are adsorbed onto the surface and cannot cause alteration of a characteristic of the specimen during the analysis. One system configured to analyze a specimen includes an analysis subsystem configured to analyze the specimen while the specimen is disposed in a vacuum chamber and an element disposed within the vacuum chamber. A surface of the element is cooled such that molecules in the vacuum chamber are adsorbed onto the surface and cannot cause alteration of a characteristic of the specimen during the analysis.

31 Claims, 4 Drawing Sheets

U.S. PATENT DOCUMENTS

| | | |
|---|---|---|
| 6,259,960 B1 | 7/2001 | Inokuchi |
| 6,414,323 B1 * | 7/2002 | Abe et al. ............... 250/443.1 |
| 6,514,866 B2 | 2/2003 | Russell et al. |
| 6,633,831 B2 | 10/2003 | Nikoonahad et al. |
| 6,730,237 B2 | 5/2004 | Sievers et al. |
| 6,787,783 B2 * | 9/2004 | Marchman et al. ....... 250/492.2 |
| 6,843,927 B2 | 1/2005 | Nasser-Ghodsi |
| 6,921,722 B2 | 7/2005 | Ogure et al. |
| 6,943,350 B2 * | 9/2005 | Nasser-Ghodsi et al. .... 250/310 |
| 2004/0185583 A1 * | 9/2004 | Tomoyasu et al. ............. 438/8 |

FOREIGN PATENT DOCUMENTS

JP  2001319923  11/2001

* cited by examiner

SYSTEMS AND METHODS FOR REDUCING ALTERATION OF A SPECIMEN DURING ANALYSIS FOR CHARGED PARTICLE BASED AND OTHER MEASUREMENT SYSTEMS

BACKGROUND OF THE INVENTION

1. Field of the Invention

The present invention generally relates to systems and methods for reducing alteration of a specimen during analysis for charged particle based and other measurement systems that involve direct or incidental impingement or ejection of electrons or ions, which might catalyze a surface contamination reaction or deposition or removal of a measured species. Certain embodiments relate to a system that includes an element, which is disposed within a vacuum chamber, and which has a surface that is cooled such that molecules in the vacuum chamber are adsorbed onto the surface.

2. Description of the Related Art

The following description and examples are not admitted to be prior art by virtue of their inclusion in this section.

Fabricating semiconductor devices such as logic and memory devices typically includes processing a substrate such as a semiconductor wafer using a number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polish, etch, deposition, and ion implantation. Multiple semiconductor devices may be fabricated in an arrangement on a semiconductor wafer and then separated into individual semiconductor devices.

As the dimensions of semiconductor devices shrink, metrology and analysis processes used to measure characteristics of the semiconductor devices become increasingly important. For instance, the acceptable variation in the characteristics of the features of the semiconductor devices (e.g., critical dimension, "CD") also decreases. Therefore, accuracy requirements of metrology and analysis processes and tools have become more stringent. In addition, as the dimensions of semiconductor devices shrink, the capability of metrology tools (e.g., resolution) have been increased. In many instances, previously sufficient technologies (e.g., optical microscopy) have been replaced with more advanced and complex technologies including charged particle beam systems (e.g., scanning electron microscopy, "SEM").

There are, however, some disadvantages to using charged particle beam based inspection, metrology, and/or analysis tools for semiconductor applications. For instance, in the presence of an electron beam, molecules present in the vacuum chamber of the tool or on the surface of the specimen may react with the specimen itself. Such reactions may result in the formation of a foreign material on the specimen such as a carbon containing material. Other reactions may result in the reduction or removal of one or more elements or molecules from the specimen.

Results of analysis of a specimen performed by charged particle beam based tools may be affected by such reactions. For instance, in the case of a reaction which produces a material on the surface of the specimen, a metrology tool may produce a measurement that reflects the dimensions of the specimen after the formation of the material, not the dimensions of the specimen as produced by the semiconductor manufacturing process. In the case of a reaction that removes material from the specimen, an analysis tool may produce a measurement that reflects the composition of the specimen after the removal of the material, not the composition of the specimen as produced by the semiconductor manufacturing process, or not the composition of a foreign particle being analyzed in a SEM based review system.

The reactions described above, therefore, reduce the accuracy of the charged particle beam based tools. In addition, the reactions described above may reduce the precision of the charged particle beam based tools. As a result, any process monitoring and control carried out based on the results of these tools may not be effective at maintaining or increasing the yield of the semiconductor manufacturing process. In some instances, in fact, process monitoring and control performed using results produced by these tools may actually be counterproductive resulting in decreased yield.

Possibly more important, however, are the changes to the specimen caused by the reactions that take place in charged particle beam based tools. In particular, it is often advantageous to perform inspection, metrology, and analysis of product wafers. Product wafers can be generally defined as wafers on which devices are actually formed, as opposed to monitor wafers, which may only be processed through a limited number of manufacturing processes to monitor a subset of semiconductor manufacturing processes. In this manner, devices are not actually formed on monitor wafers, and instead monitor wafers are usually reworked or scrapped after inspection, measurement, or analysis. Inspection, measurement, or analysis of product wafers is, therefore, generally preferred since the results may more accurately reflect the actual characteristics of other product wafers.

However, any change to the product wafer caused by reactions that take place in charged particle beam based tools may alter the characteristics of the product wafer to such a degree that device performance, speed, and/or device longevity may be adversely affected. In a worst case scenario, the devices can no longer be successfully formed on the product wafer. Obviously, such effects on product wafers are highly undesirable due to the cost involved in producing product wafers. In addition, even if devices can be successfully manufactured on the altered product wafer, the alterations may adversely affect the bin yield, and therefore the profitability, of the semiconductor manufacturing process.

Attempts have been made to reduce the effects of processes performed by charged particle beam based tools on specimens such as wafers. One such approach involves increasing the turbo pumping performed on the analysis chamber in which inspection, metrology, or analysis of the specimen is carried out and/or the load lock chamber in which the specimen is located before introduction to the analysis chamber. However, such an approach may have limitations in that performance will be determined by the size and type of pump, conductance of the pump to the chamber, and the time that the wafer can remain in the load lock chamber. In addition, the source of reactant molecules may be in the analysis chamber itself, in which case additional pumping in the load lock will have no effect on reducing undesirable reactions on the surface of the specimen.

Another approach that may be used alone or in combination with increased turbo pumping is to heat the specimen either before or during the process performed by the charged particle beam based tool. Such an approach may be disadvantageous for a number of reasons. For instance, it may be disadvantageous to heat some types of specimens on which materials are present (such as resist or low K dielectrics) that may be altered by such heating. In addition, such heating of the specimen may reduce throughput of the tool since time is required for the temperature of the specimen to stabilize before any measurements are performed.

Accordingly, it may be advantageous to develop systems and methods for reducing alteration of a specimen during analysis by substantially preventing any reactions from taking place in charged particle beam based tools thereby substantially preventing contamination of the specimen, substantially increasing the accuracy and/or precision of the tools, substantially increasing the effectiveness of process control and monitoring performed using results of the analysis, or some combination thereof without substantially changing the temperature of the specimen.

SUMMARY OF THE INVENTION

The following description of various embodiments of systems and methods is not to be construed in any way as limiting the subject matter of the appended claims.

An embodiment relates to a system configured to reduce alteration of a specimen during analysis. The system includes a vacuum chamber in which the specimen is disposed during the analysis. The system also includes an element disposed within the vacuum chamber. A surface of the element is cooled such that molecules in the vacuum chamber are adsorbed onto the surface and cannot cause alteration of a characteristic of the specimen during the analysis.

In one embodiment, the molecules include hydrocarbons, water vapor, or a combination thereof. In some embodiments, the characteristic of the specimen includes a dimension of structures formed on the specimen. In another embodiment, the characteristic of the specimen includes an amount of a compound or an element, such as nitrogen and/or oxygen, contained within a structure formed on the specimen. In a further embodiment, the characteristic of the specimen includes an amount of a material (e.g., one or more molecules and/or one or more elements) contained within the specimen. In such an embodiment, the material can participate in a surface or near surface charged particle catalyzed reaction with the molecules.

In one embodiment, the surface of the element is cooled such that a temperature of the specimen is not substantially altered by the element. In some embodiments, the element is disposed along an inner surface of the vacuum chamber. In a different embodiment, the element is disposed above the specimen. Each of the embodiments of the system described above may be further configured as described herein.

Another embodiment relates to a system configured to analyze a specimen. The system includes an analysis subsystem configured to analyze the specimen while the specimen is disposed in a vacuum chamber. The system also includes an element disposed within the vacuum chamber. A surface of the element is cooled such that molecules in the vacuum chamber are adsorbed onto the surface and cannot cause alteration of a characteristic of the specimen during the analysis.

In one embodiment, the molecules include hydrocarbons, water vapor, or a combination thereof. In some embodiments, the characteristic of the specimen includes a dimension of structures formed on the specimen. In another embodiment, the characteristic of the specimen includes an amount of nitrogen and/or oxygen contained within a layer or structure formed on the specimen.

In one embodiment, the analysis subsystem includes a charged particle beam subsystem. In an additional embodiment, the analysis subsystem is configured to analyze the specimen using a technique that involves direct or incidental electron ejection. In a further embodiment, the analysis subsystem is configured to analyze the specimen using incident x-rays. In another embodiment, the analysis subsystem is configured as an inspection subsystem, a metrology subsystem, or an inspection and metrology subsystem.

In some embodiments, the system is configured to control a cooling subsystem coupled to the element such that the surface of the element is not cooled during the analysis. In another embodiment, the system is configured to control a cooling subsystem coupled to the element such that the surface of the element is cooled while the analysis subsystem is performing one or more pre-analysis functions.

In one embodiment, the element is disposed along an inner surface of the vacuum chamber and outside of a measurement path of the analysis subsystem. In a different embodiment, the element is disposed between the specimen and the analysis subsystem. In such an embodiment, the element is configured such that a measurement path of the analysis subsystem passes through the element. In other embodiments, the element is coupled to the analysis subsystem. In some embodiments, the element is configured such that a temperature of the specimen is not substantially altered by the surface of the element. Each of the embodiments of the system described above may be further configured as described herein.

An additional embodiment relates to a method for reducing alteration of a specimen during analysis. The method includes creating a vacuum in a chamber in which the specimen is disposed during the analysis. The method also includes cooling a surface of an element disposed in the chamber to cause molecules in the chamber to be adsorbed onto the surface such that the molecules cannot cause alteration of a characteristic of the specimen during the analysis.

In one embodiment, cooling the surface of the element is not performed during the analysis. In another embodiment, cooling the surface of the element is performed during one or more pre-analysis functions performed while the specimen is in the chamber. In one such embodiment, cooling the surface of the element is not performed during the analysis.

In some embodiments, the analysis includes inspection or metrology. In another embodiment, the characteristic of the specimen includes a dimension of structures formed on the specimen. In an additional embodiment, the characteristic of the specimen includes an amount of nitrogen and/or oxygen contained within a structure formed on the specimen. In one embodiment, a temperature of the specimen is not substantially altered by cooling of the surface of the element. In some embodiments, the molecules include hydrocarbons, water vapor, or a combination thereof. Each of the embodiments of the method described above may include any other step(s) described herein.

A further embodiment relates to a system configured to analyze a specimen. The system includes an analysis subsystem configured to analyze the specimen while the specimen is disposed in a vacuum chamber. The analysis subsystem includes a charged particle beam source. The system also includes an element disposed within the vacuum chamber. A surface of the element is cooled such that molecules in the vacuum chamber are adsorbed onto the surface and cannot cause alteration of a characteristic of the charged particle beam source. This system embodiment may be further configured as described herein.

Yet another embodiment relates to a different system configured to analyze a specimen. This system includes a scanning probe microscope that is configured to analyze the specimen while the specimen is disposed in an analysis chamber. The system also includes an element disposed within the analysis chamber. A surface of the element is cooled such that molecules in the analysis chamber are adsorbed onto the surface and cannot cause alteration of a characteristic of the specimen during the analysis. In one embodiment, the scanning probe microscope includes an atomic force microscope or a scanning tunneling electron microscope. Each of the embodiments of the system described above may be further configured as described herein.

A further embodiment relates to a system configured to process a specimen. This system includes a charged particle beam subsystem configured to catalyze a process performed on the specimen while the specimen is disposed in a vacuum chamber. The system also includes an element disposed within the vacuum chamber. A surface of the element is cooled such that molecules in the vacuum chamber are adsorbed onto the surface and cannot alter the process being performed at a surface of the specimen.

In one embodiment, the charged particle beam subsystem is configured as a focused ion beam tool. In a different embodiment, the charged particle beam subsystem is configured as an electron beam tool. In some embodiments, the process includes deposition or etch. Each of the embodiments of the system described above may be further configured as described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
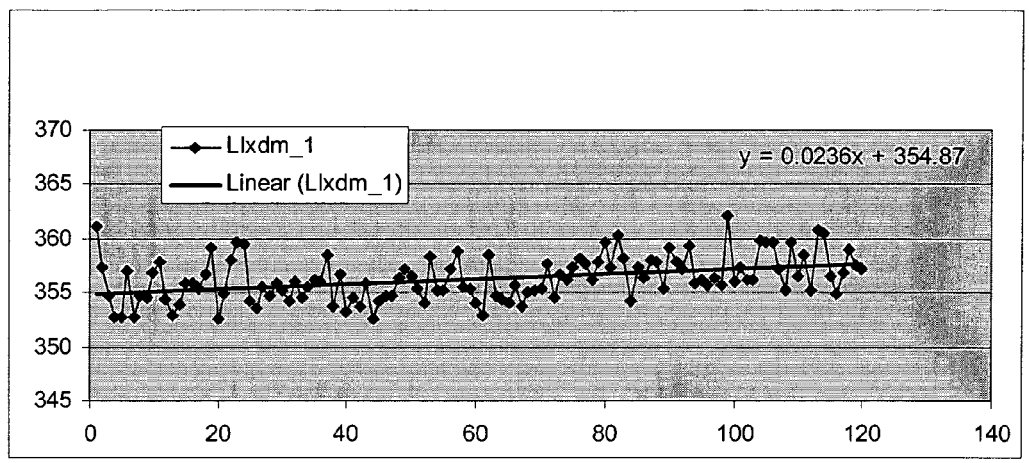
FIG. 1 is a plot illustrating line width as a function of the number of measurements, which were performed in a vacuum chamber in which gases were removed by a turbo pump coupled to the vacuum chamber.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "specimen" refers to a reticle or a wafer. The terms "reticle" and "mask" are used interchangeably herein. A reticle generally includes a transparent substrate such as glass, borosilicate glass, and fused silica having opaque regions formed thereon in a pattern. The opaque regions may be replaced by regions etched into the transparent substrate. Many different types of reticles are known in the art, and the term reticle as used herein is intended to encompass all types of reticles.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities. A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

FIG. 1 illustrates line width or "critical dimension" (CD) measurements as a function of the number of measurements. The measurements were performed by a scanning electron microscope (SEM). In addition, the measurements were performed while a wafer was located in a vacuum chamber in which gases were removed by a turbo pump coupled to the vacuum chamber. No other removal or control of the molecules in the vacuum chamber was performed during these measurements.

As shown in FIG. 1, the line width measurements increase as the number of measurements increase. Such increase in the line width measurements over time may be commonly referred to as "carryover." Carryover may be attributed to a reaction that takes place in the vacuum chamber due to the presence of molecules in the vacuum chamber. In particular, a reaction between the molecules in the vacuum chamber and/or molecules on the specimen with the materials of the specimen may be initiated by the electron beam of the SEM. The molecules may include, for example, hydrocarbons and water that were not completely removed by the turbo pump. Such reactions may produce a layer of a carbon containing material on the specimen by polymerization, which causes the dimensions of the structures formed on the specimen to get larger (e.g., thicker and taller) over time.

Obviously, such changes in the line width measurements across the number of measurements is highly undesirable. In particular, since the line width changes as a function of time, the measurement-to-measurement comparison for a single specimen and the specimen-to-specimen comparison of line width is highly dependent on the time at which the measurements were performed during the metrology process. In this manner, carryover reduces the repeatability of the measurements. In addition, the changes in the actual line width lead to relatively high inaccuracy and/or low precision in the line width measurements performed on the specimen.

Furthermore, the measurements may reflect the line width of structures formed on the specimen after a reaction byproduct has been formed on the structures. As such, the line width measurements may not accurately reflect the line width of the structures as formed by the semiconductor manufacturing processes used to fabricate the specimen. Obviously, therefore, such measurements may reduce the effectiveness of process monitoring and control performed using the line width measurements thereby limiting the achievable yield of the semiconductor manufacturing process. Such inaccuracy in the line width measurements may also reduce the accuracy of the calibration of the analysis subsystem.

Moreover, such formation of a reaction byproduct on the specimen may contribute to contamination of the specimen. The contamination of the specimen may adversely affect the characteristics of devices formed on the specimen. For example, even if the reaction byproduct consists of a relatively thin layer of material formed on the structures (e.g., on the order of a monolayer), the byproduct can adversely affect characteristics of the device particularly as the dimensions of the structures decrease. In this manner, the reaction byproduct may alter the electrical characteristics of the structures. In addition, such adverse effects on the characteristics of devices may not be detected until the fabrication of the devices has been completed (e.g., during electrical testing of the devices). As such, the contamination may result in increased manufacturing costs and reduced yields. Therefore, it would be highly advantageous to reduce carryover caused on the specimen by a metrology process, any other charged particle beam based measurement process, or any surface measurement process that involves the direct or incidental impingement or ejection of electrons, which might catalyze a surface contamination reaction or deposition or removal of a measured species.

Figure 2:
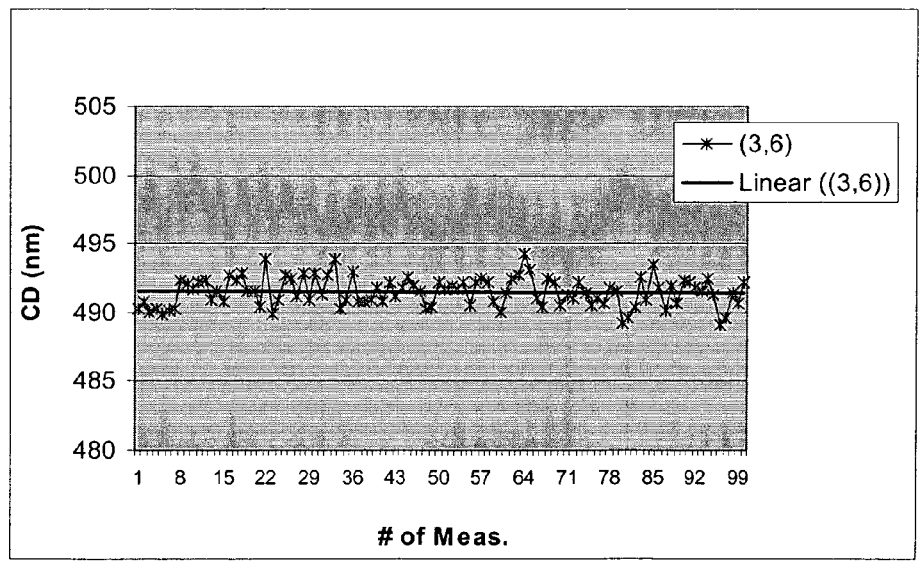
FIG. 2 is a plot illustrating line width as a function of the number of measurements, which were performed in a vacuum chamber in which molecules were adsorbed by a cooled surface external to, but in fluid communication with, the vacuum chamber.

FIG. 2 illustrates other line width measurements as a function of the number of measurements. These measurements were also performed by a SEM. In addition, these measurements were performed while a wafer was located in a vacuum chamber in which molecules were adsorbed by a cooled surface located in a housing attached to the side of the vacuum chamber. The surface may be cooled cryogenically and may function to "pump" molecules out of the vacuum chamber. Therefore, this "pump" may be referred to as a "cryopump."

If the cryogenically cooled surface was located within the vacuum chamber, either near or above the sample as described further herein, the conductance of the molecules to the cooled surface would be much greater, and therefore the effectiveness of this surface for adsorbing contaminants and reactants from within the vacuum chamber would be much greater. This type of setup may be referred to as a "cryogenically cooled panel," which may be configured in a SEM system or any other system as described further herein.

As shown in FIG. 2, the line width measurements are relatively stable or constant across the number of measurements. Therefore, unlike the measurements shown in FIG. 1, the measurements shown in FIG. 2 do not exhibit carryover. Such reduction in the carryover compared to the line width measurements of FIG. 1 may be attributed to the increased control over the molecules in the vacuum chamber provided by the use of a cryopump. In particular, as described further herein, the surface of the element (in this case, enclosed in the cryopump housing) may be cooled to a temperature that results in adsorption of molecules in the vacuum chamber onto the cooled surface of the element. The molecules may include hydrocarbons and/or water molecules such as water vapor. The molecules may also originate from the specimen itself such as a layer of residual water vapor present on the specimen and/or from within the vacuum chamber (or one or more elements disposed within the vacuum chamber) such as hydrocarbons from elements in the vacuum chamber and/or moisture present in the vacuum chamber. As described further herein, such adsorption reduces significantly the number of molecules that are available for reaction with the specimen during the analysis thereby reducing changes in the actual line width and the measured line width during the measurements. Such stability in the measurements of line width is also achievable using other embodiments described herein. Therefore, the embodiments described herein may be used to substantially eliminate carryover.

Obviously, such stability in the measurements of line width has a number of advantages over measurements that change over time. In particular, the measurements are more accurate and/or precise than measurements performed during or after a reaction. In this manner, the measurements may more accurately reflect the actual dimensions of structures formed on the specimen by semiconductor manufacturing processes. As such, the measurements may be used for highly accurate process monitoring and control of such semiconductor manufacturing processes, which may increase yield of the semiconductor manufacturing processes. In addition, the measurements themselves, due to the substantial elimination of a reaction between the specimen and molecules in the vacuum chamber during the measurements, do not contribute to contamination of the specimen. Eliminating such contamination of the specimen is particularly important for measurements that are performed on product wafers. For example, since the measurements will not cause contamination of specimens such as product wafers, the measurements themselves do not reduce yield of the semiconductor manufacturing processes and do not increase costs of the semiconductor manufacturing processes.

Figure 3:
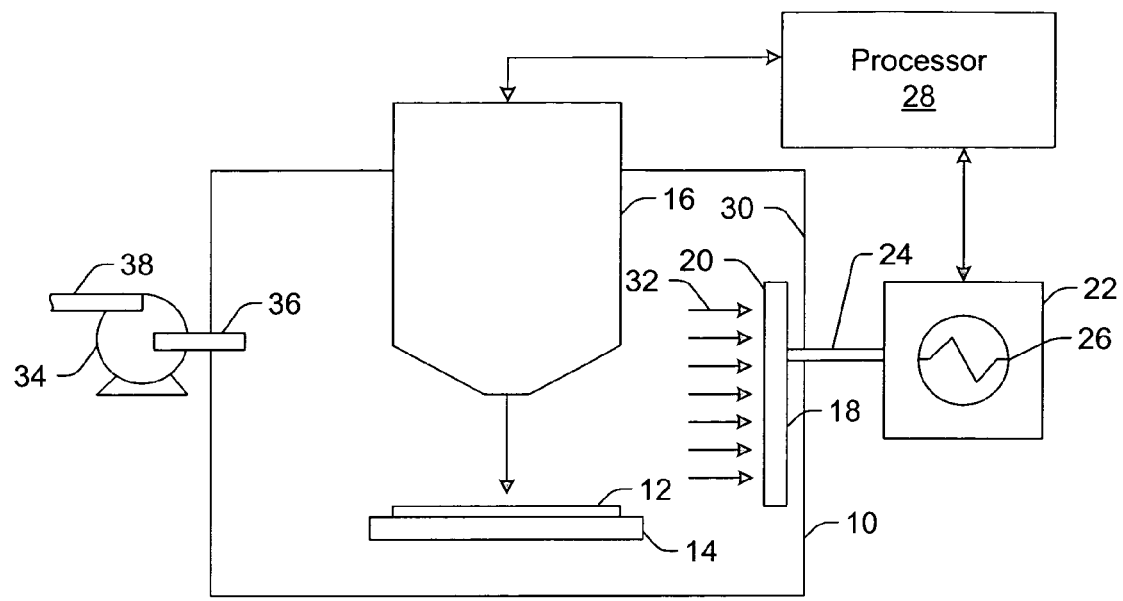
FIGS. 3-5 are schematic diagrams illustrating side views of different embodiments of a system configured to reduce alteration of a specimen during analysis and to analyze the specimen.

FIG. 3 illustrates one embodiment of a system configured to reduce alteration of a specimen during analysis. The system includes vacuum chamber 10 in which specimen 12 is disposed during the analysis. Specimen 12 may be disposed on stage 14 within vacuum chamber 10 during the analysis. Stage 14 may include any suitable mechanical and/or robotic assembly known in the art. As shown in FIG. 3, specimen 12 and stage 14 may be wholly contained within vacuum chamber 10 during the analysis. Vacuum chamber 10 may include any suitable vacuum chamber known in the art. In particular, vacuum chamber 10 may include any vacuum chamber that is suitable for use with a charged particle beam based tool such as a charged particle beam based tool configured to perform inspection, metrology, analysis such as composition analysis, defect review, or some combination thereof of specimen 12. In addition, vacuum chamber 10 may include any vacuum chamber that is suitable for use with any other tools described herein.

Although embodiments are described herein with respect to electron beam based tools, it is to be understood that the charged particle beam based tools may be non-electron beam tools such as ion beam based tools. One such ion beam based tool is a focused ion beam (FIB) tool that may be used for metrology, analysis, repair, or some combination thereof of a specimen. Another such ion beam based tool is a secondary ion mass spectroscopy ("SIMS") tool that can be used for analysis of a specimen (e.g., to determine a concentration of an element in a structure formed on the specimen).

Also, embodiments of an analysis subsystem described herein may be configured to perform any surface measurement process that involves the direct or incidental impingement or ejection of electrons or ions, that can cause undesirable surface reactions with contaminants and reactants within the chamber, which can in turn cause deposition or removal of a measured species. One example of such a system would be an electron beam based etch and/or deposition system, where the electron beam is used to catalyze an etch or surface deposition reaction, and greater control over the sample surface chemistry and chamber environment will allow for improved etching and deposition. In another embodiment, the analysis subsystem is configured to analyze the specimen using incident x-rays. Examples of analysis subsystems that may be included in the systems described herein include analysis subsystem that may be configured to perform one or more processes such as, but not limited to, low energy electron diffraction (LEED) spectroscopy, low energy electron microscopy (LEEM), X-ray photoelectron spectroscopy (XPS), X-ray fluorescence spectroscopy (XFS), Auger electron spectroscopy (AES), or some combination thereof The system may also include electron column 16. The electron column generally functions to focus electrons (not shown) on specimen 12. Electron column 16 may form part of an analysis subsystem of the system shown in FIG. 3. The analysis subsystem is configured to analyze specimen 12 while the specimen is disposed in vacuum chamber 10. In one embodiment, therefore, the analysis subsystem includes a charged particle beam subsystem. In this manner, the system shown in FIG. 3 may be configured to analyze specimen 12. For example, the system may be configured to inspect specimen 12, to measure one or more characteristics of specimen 12 by metrology or analysis, to review defects on specimen 12, or some combination thereof. As such, the analysis subsystem may be configured as an inspection subsystem, a metrology subsystem, an inspection and metrology subsystem, a defect review subsystem, etc. In this manner, the system shown in FIG. 3 may be configured as an inspection tool, a metrology tool, an analysis tool, a defect review tool, or some combination thereof. As shown in FIG. 3, at least the portion of the electron column proximate the specimen where the electrons exit the electron column is located in vacuum chamber 10. As further shown in FIG. 3, the entire electron column may not be located in vacuum chamber 10.

Electron column 16 may have any suitable configuration known in the art. For example, the electron column may be configured such that the analysis subsystem is configured as a SEM, a secondary emission electron microscope, or another electron beam based metrology tool. In addition, the electron column configuration may be suitable for metrology and/or other functions described above. The electron column may also have a configuration similar to that of electron columns included in SEM based systems that are commercially available from, for example, Applied Materials, Santa Clara, Calif. and KLA-Tencor, San Jose, Calif. Examples of SEM based systems that are available from KLA-Tencor include the 8250, 8250-R, 8450, eCD-1, and eCD-x systems.

The system also includes element 18 disposed within vacuum chamber 10. Surface 20 of element 18 is cooled such that molecules (not shown) in vacuum chamber 10 are adsorbed onto the surface. The molecules may include hydrocarbons, water molecules such as water vapor, or some combination thereof. The molecules that are adsorbed onto surface 20 may be selected by controlling the temperature of the surface. For example, the surface of element 18 may be low enough to result in the selected molecules being at least partially solidified or at least partially crystallized ("frozen out"), which results in adsorption of the molecules onto the surface of element 18. In one particular example, when the molecules that are to be adsorbed onto surface 20 of element 18 include water molecules and organic materials, surface 20 of element 18 may be cooled to a temperature between about 75 K and about 135 K such that other molecules such as nitrogen and oxygen are not adsorbed onto the surface of the element. Obviously, the temperature of the surface of the element may vary depending on the molecules that are selected to be adsorbed onto the surface of the element and the volatility of these molecules.

It should be noted that although the system described above includes the cooled surface placed within the vacuum chamber, some degree of improvement for carryover can be expected, and is shown in FIGS. 1 and 2, even if the cooled surface is placed in its own housing attached to the side of the chamber. Such a cooled surface may be in fluid communication with the vacuum chamber (e.g., via a conduit coupled between the cooled surface housing and the environment within the vacuum chamber). However, placing the cooled surface within the vacuum chamber will dramatically increase the pumping speed (i.e., adsorption rate) of water, hydrocarbons, and other contaminants within the chamber, and will therefore be that much more effective at reducing undesirable reactions induced by impinging or ejected electrons at the specimen surface. In this manner, a cooled surface located within a vacuum chamber is the preferred arrangement for construction of the system.

By maintaining the temperature of surface 20 of element 18 at about a temperature at which the molecules may be at least partially solidified, the molecules may be maintained on the surface of the element (e.g., during the entire process performed in vacuum chamber 10). In this manner, the molecules cannot cause alteration of a characteristic of the specimen during the analysis. In one embodiment, the characteristic of the specimen includes a dimension of structures (not shown) formed on the specimen. In particular, adsorption of the molecules on the cooled surface inhibits reactions that may otherwise take place on the surface of a sample exposed to direct or incidental impingement or ejection of electrons or ions in the vacuum chamber and that could change the dimensions of structures on the specimen.

The structures may include, for example, line structures, contact structures, via structures, trench structures, or any other structures that have some three-dimensional shape. The structures may also be formed of various materials commonly used in semiconductor manufacturing. For example, the systems described herein may be used to reduce carryover on specimens containing polysilicon line structures or any other structures known in the art. In addition, the dimension of the structures that is relatively constant across time due to the embodiments described herein may include a line width or any other cross-sectional dimension and a height.

The embodiments described herein can be used, therefore, to reduce, and even substantially eliminate, carryover. In particular, line width growth with successive dynamic measurements (e.g., performed after loading and unloading of the specimen) and successive static measurements (e.g., performed without unloading of the specimen) is greatly reduced. In this manner, the use of a system configured as described herein (e.g., a system including a cryogenically cooled panel or other cooled surface that may be configured as described herein) to reduce carryover during a CD SEM measurement may be advantageous to increase the accuracy of the measurements performed by the CD SEM. Obviously, reducing carryover is advantageous in of itself, but since it is eliminated by reduced interactions between the charged particle beam, molecules in the analysis vacuum chamber, and the specimen, reducing carryover also results in reduced sample contamination.

The molecules that are adsorbed by the cooled surface may include molecules from the specimen itself. Such molecules may include water and/or hydrocarbons adsorbed on the specimen surface and/or present in a material on the specimen such as a resist, which may serve as reactants during the analysis of the specimen. In addition, the molecules may include molecules such as water vapor and/or hydrocarbons from within the vacuum chamber. Such molecules in the vacuum chamber may result from insufficient pumping or removal of gases such as water vapor from vacuum chamber 10 and/or hydrocarbons from mechanical and/or other elements within vacuum chamber 10. For example, such molecules may include hydrocarbons from sources in the vacuum chamber such as the stage, the chamber, the wires, and the pump lubricants, which may serve as reactants during the analysis of the specimen.

Element 18, therefore, acts to freeze out hydrocarbons and water vapor from the chamber environment thereby reducing the equilibrium surface coverage of molecules on the specimen in the vacuum chamber during CD measurement by an electron beam. In other words, the adsorption of the molecules on the element reduces the redeposition of the molecules back onto the specimen. In this manner, the reactants described above may be present at much lower concentrations at the point on the specimen surface that is exposed to the charged particle beam during the analysis. In addition, by placing a cooled surface such as a cryogenically cooled surface inside of vacuum chamber 10, the effective hydrocarbon and water vapor pumping ("removal") can be much greater than that achievable by pumping with the turbo alone.

In this manner, controlling molecules in a vacuum chamber using the systems described herein have a number of advantages over other systems and methods for reducing unwanted molecules from within a vacuum chamber during a process that involves either direct or incidental impinging or ejection of electrons or ions. In particular, compared to heating of a specimen, which can only remove molecules from the specimen itself, the systems described herein can adsorb molecules from both the specimen and from other sources within the vacuum chamber thereby resulting in substantially complete elimination of the carryover effect. Furthermore, unlike heating processes after which the molecules may redeposit on the specimen, the embodiments described herein can control the molecules in the vacuum chamber during the entire analysis process thereby increasing the accuracy of the measurements in comparison to measurements performed after heating of the specimen.

In addition, in one embodiment, the surface of the element is cooled such that a temperature of the specimen is not substantially altered by the element. For example, the temperature of the surface of the element in combination with the configuration of the element and the location of the element with respect to the specimen may be selected such that the element itself does not effectuate a temperature change of the specimen. Eliminating the carryover effect without altering a temperature of the specimen either by heating and/or cooling eliminates the time required for stabilization of specimen temperature, thereby improving system throughput, and advantageously reduces the potential for damage to the specimen by heating or cooling or sudden or drastic temperature changes.

As further shown in FIG. 3, element 18 may be coupled to cooling subsystem 22 via conduit 24. Although cooling subsystem 22 is shown in FIG. 3 to symbolically include heat exchanger 26, it is to be understood that the cooling subsystem may include any appropriate refrigeration unit and/or other components known in the art. In addition, the configuration of the cooling subsystem may be selected based on the temperatures to which surface 20 of element 18 is to be cooled. One example of an appropriate cooling subsystem/element combination is a cryogenically cooled panel. Examples of commercially available components that are particularly suitable for use as a cryogenically cooled panel in the systems described herein include onboard water pump model 1050 used as a refrigeration unit and compressor model 9600, both of which are commercially available from Helix Technology Corporation, Mansfield, Mass. The refrigeration unit may have a cooling capacity of about 80 W. The element may be formed as a relatively thick panel of copper. The panel may be coated with a material such as nickel to increase the optical reflectance of the panel and the non-reactivity of the panel. Conduit 24 may include any appropriate conduit and/or elements known in the art. As shown in FIG. 3, cooling subsystem 22 is disposed outside of vacuum chamber 10. Such placement of the cooling subsystem may be selected such that the size of the vacuum chamber does not have to be increased to accommodate the cooling subsystem.

Cooling subsystem 22 may, therefore, control the temperature of surface 20 of element 18. In addition, cooling subsystem 22 may be controlled by the system. In one such embodiment, processor 28 of the system may be configured to control cooling subsystem 22. Processor 28 may be configured to control cooling subsystem 22 such that the cooling subsystem operates during predetermined or selected times. For example, in one embodiment, the system is configured to control cooling subsystem 22 such that the surface of the element is not cooled during analysis of specimen 12. Such an embodiment may be advantageous if the cooling subsystem may cause vibration of one or more elements of the system. Since such vibration may adversely affect the measurements performed by the system, the cooling subsystem may be "turned off" during analysis. Such intermittent cooling of surface 20 of element 18 may be sufficient since while the cooling subsystem is not operating, the temperature increase of the surface of the element may not be significant enough to cause desorption of molecules from the surface of the element. In addition, the temperature to which surface 20 is cooled prior to analysis may be selected to account for variation in the temperature of the surface caused by turning off the cooling subsystem.

In another embodiment, the system is configured to control cooling subsystem 22 such that the surface of the element is cooled while the analysis subsystem of which electron column 16 forms at least a part is performing one or more pre-analysis functions. For example, prior to measurement of a line width of a structure on a specimen or another inspection, metrology, and/or analysis function, the analysis subsystem may perform one or more non-analysis operations such as calibration, specimen alignment, etc. In this manner, operation of the cooling subsystem may be confined by the system software to moments when vibration caused by the cooling subsystem is not critical such as when the wafer is being loaded, when optical pattern recognition for global alignment is being performed, when the stage is being moved, and when pattern recognition is being performed. Although these functions are preferably performed with high accuracy, the amount of vibration introduced by cooling subsystem 22 may not be significant enough to reduce the accuracy of the pre-analysis functions. In addition, such control of the cooling subsystem allows a sufficiently cold temperature of surface 20 to be maintained without blurring of the area exposed to the charged particle beam, which distorts results of the analysis subsystem such as CD measurement. Furthermore, the time during which the surface of element 18 is not cooled by cooling subsystem 22 (e.g., during inspection, measurement, or analysis of specimen 12) may be minimized, which may improve the performance of molecule adsorption.

Processor 28 may include any suitable processing device known in the art. In addition, processor 28 may be configured to control cooling subsystem 22 using any method and/or technique known in the art. Furthermore, processor 28 may be coupled to cooling subsystem 22 using any device and/or method known in the art. Processor 28 may also be configured to perform other functions. For example, processor 28 may be coupled to electron column 16. Processor 28 may be coupled to electron column 16 using any method and/or device known in the art. In addition, processor 28 may be coupled to electron column 16 such that the processor may control one or more functions of the electron column. Processor 28 may also be coupled to electron column 16 such that the processor may receive output from electron column 16. In this manner, processor 28 may be configured to perform one or more functions on the output of the electron column. The one or more functions performed by processor 28 on the output of the electron column may include any inspection, metrology, and/or analysis functions known in the art such as detecting defects, determining line width and/or other dimensions of structures on the specimen, determining a composition of one or more structures on the specimen using the output, one or more defect review functions, or some combination thereof.

Element 18 may be configured as a panel that is relatively flat with a relatively large surface area. However, the configuration of element 18 may vary depending on the desired molecular control of the element. For example, the surface area of the element may be selected based on the expected amount of molecules that will be adsorbed onto the surface of the element. In addition, the configuration of element 18 may vary depending on the configuration of vacuum chamber 10 and other elements disposed within the vacuum chamber. For example, the configuration of element 18 may be selected such that the element may be retrofitted into existing vacuum chambers without substantial reconfiguration of the system and/or adverse effects on the operation of the system.

As further shown in FIG. 3, element 18 is disposed along inner surface 30 of vacuum chamber 10. In this manner, element 18 may be placed along one surface of the vacuum chamber such that the element can draw hydrocarbons away from sources inside the vacuum chamber such as the stage mechanisms and water and hydrocarbons from the specimen surface. Molecules within the vacuum chamber may generally follow paths 32 from within the vacuum chamber to surface 20 of element 18. Element 18 may or may not be attached to inner surface 30 of vacuum chamber 10. In addition, as shown in FIG. 3, the element may be spaced from inner surface 30 of vacuum chamber 10. Since the element is disposed along inner surface 30 of vacuum chamber 10, the element may be located outside of a measurement path of the analysis subsystem. The measurement path is generally located between the lowermost surface of electron column 16 and specimen 12. However, the element may be disposed in any other position described herein.

Although the system of FIG. 3 is shown to include one element, it is to be understood that the system may include more than one element. The elements may be positioned at substantially different locations within the vacuum chamber (e.g., along substantially opposite inner surfaces of the vacuum chamber or proximate known sources of molecules in the vacuum chamber). Alternatively, the elements may be positioned at approximately the same location within the vacuum chamber (e.g., along the same inner surface of the vacuum chamber and substantially adjacent to one another). Each of the elements may be coupled to different cooling subsystems. Alternatively, each of the elements may be coupled to the same cooling subsystem. Surfaces of the, elements may be cooled to different temperatures or substantially the same temperature. In this manner, the system may include one or more elements located within an analysis chamber that may be similarly or differently configured.

In another embodiment, the system may also include one or more such elements located within a second load lock chamber (not shown) of the system. A load lock chamber is generally a chamber into which the specimen is placed before it is placed in the analysis chamber. The load lock chamber may have any configuration known in the art. The second or intermediate load lock chamber may the chamber in which the specimen is positioned after removal from the first load lock chamber, but before being moved into the analysis chamber. By including one or more such elements in the second load lock chamber, molecules may be removed from the specimen and the second load lock chamber prior to introduction of the specimen into the analysis chamber. The elements located in the analysis chamber and the second load lock chamber may be similarly or differently configured. In addition, the elements located in the analysis chamber and the second load lock chamber may be coupled to the same cooling subsystem or different cooling subsystems.

The system shown in FIG. 3 may also include turbo pump 34 coupled to vacuum chamber 10. Turbo pump 34 is configured to remove one or more gases (not shown) from vacuum chamber 10 while specimen 12 is disposed in vacuum chamber 10. The one or more gases may include, for example, water vapor or other gases present in the vacuum chamber. In this manner, the system may be configured to control molecules in the vacuum chamber using a combination of turbo pumping and adsorption.

As further shown in FIG. 3, turbo pump 34 may be disposed outside of vacuum chamber 10 and may be configured to remove one or more gases from vacuum chamber 10 through conduit 36. The gas or gases removed by turbo pump 34 may be transferred from pump 34 through conduit 38 to one or more fluid transfer, collection, or processing components. Conduits 36 and 38 may have any suitable configuration known in the art. The system shown in FIG. 3 may be further configured as described herein.

Figure 4:
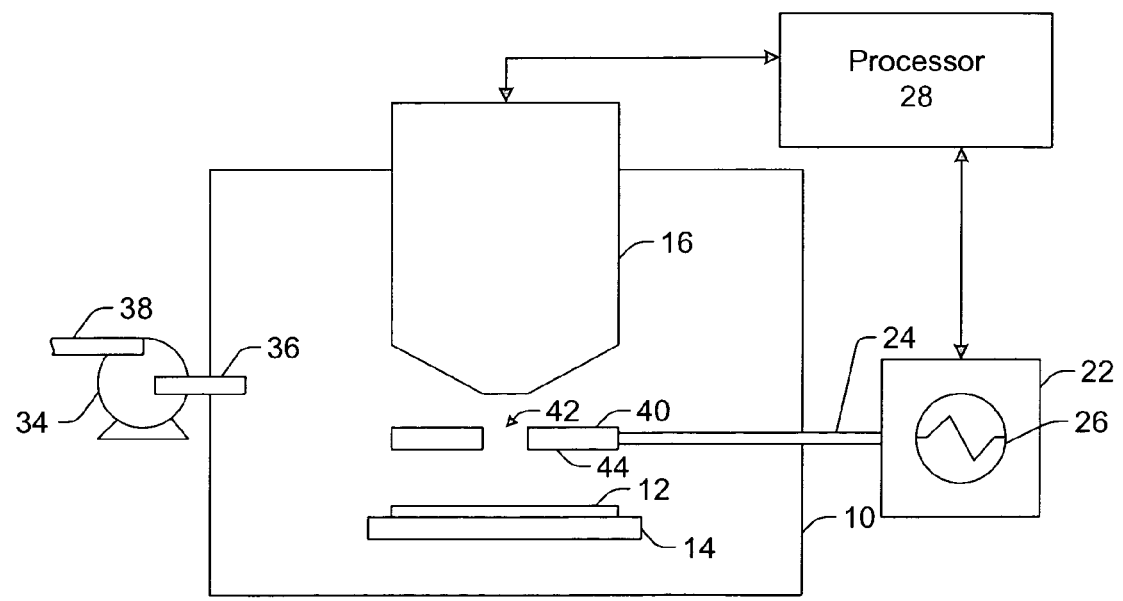

In another embodiment, the element described further above may be disposed above the specimen. One such embodiment is illustrated in FIG. 4. As shown in FIG. 4, element 40 may be disposed above specimen 12. In another embodiment, element 40 is disposed between specimen 12 and the analysis subsystem. In the embodiment shown in FIG. 4, element 40 is disposed between specimen 12 and electron column 16 that forms at least a part of the analysis subsystem. In one such embodiment, element 40 is configured such that a measurement path of the analysis subsystem passes through element 40. For example, element 40 may include opening 42 through which an electron beam may pass from electron column 16 to the specimen and from the specimen to one or more detectors of the analysis subsystem. Opening 42 may be at least as large as the cross-section of the charged particle beam of the analysis subsystem. In addition, opening 42 may be large enough to account for variation in the position of the charged particle beam such that element 40 does not interfere with the charged particle beam regardless of the position of the charged particle beam. Other than opening 42, element 40 may be a substantially continuous structure. However, element 40 may include more than one opening in some instances such as if the analysis subsystem includes multiple or non-coaxial measurement paths, if the measured signal consists of X-rays or some other part of the electromagnetic spectrum generated at the sample by interaction with the electron beam, or if other types of X-ray or electron detectors are included in the system depending on the measurement technique (LEED, LEEM, XPS, XFS, Auger, any other surface measurement spectroscopy, or some combination thereof) that the analysis subsystem is configured to perform.

As shown in FIG. 4, element 40 may be spaced from the upper surface of specimen 12. For example, the distance between element 40 and specimen 12 may be several cm. In addition, although element 40 is shown to be positioned relatively far from the upper surface of specimen 12 in FIG. 4, it is to be understood that the distance between the element and the specimen may vary. In some instances, it may be advantageous to position element 40 as close as possible to specimen 12 (obviously without contacting the specimen) such that the adsorption of potential reactants on or proximate to the specimen may be maximized. However, element 40 may also be positioned far enough away from specimen 12 such that the element does not alter the temperature of the specimen. Element 40 and all other elements of the system shown in FIG. 4 may be configured as described herein.

Positioning element 40 above specimen 12 may be advantageous in that the molecules from the specimen or proximate to the specimen that are adsorbed onto surface 44 of element 40 can travel a more direct path from specimen 12 to surface 44 than the path that the molecules travel from the specimen to surface 20 as shown in FIG. 3. In this manner, the system shown in FIG. 4 may provide more efficient collection of molecules from specimen 12 or proximate specimen 12 thereby further decreasing the effects of reactions between the molecules and the specimen on the results of analysis performed on the specimen and on the characteristics of the specimen. The system shown in FIG. 4 may be further configured as described herein.

Figure 5:
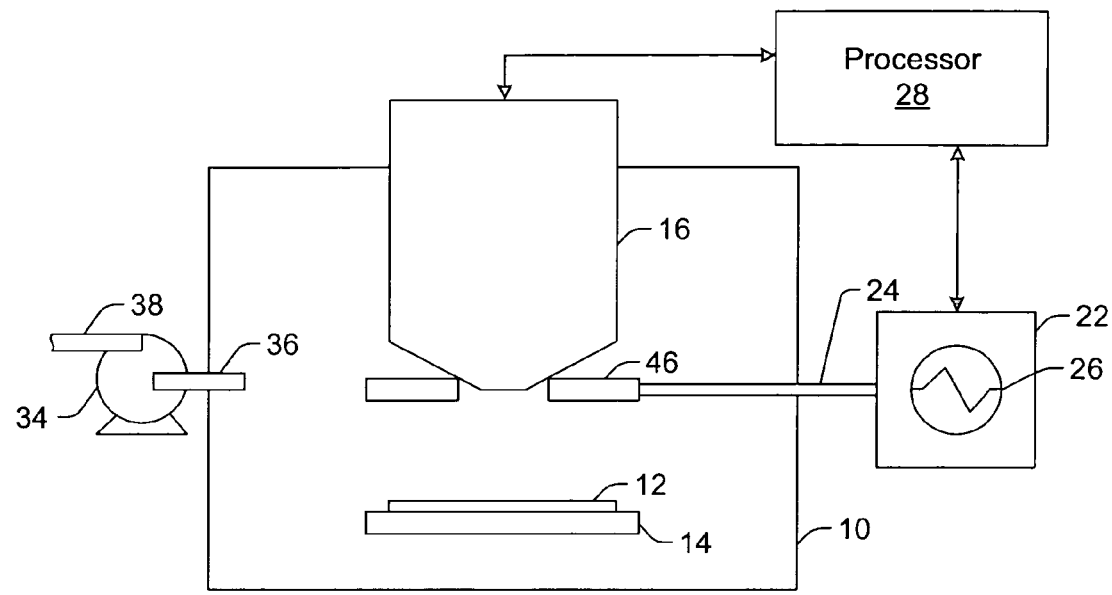

In the embodiment shown in FIG. 4, element 40 may be configured such that the element has substantially no effect either positive or negative on the charged particle beam of the analysis subsystem. In other embodiments, however, element 40 is coupled to or forms part of the analysis subsystem. For example, an element that would normally be included in the analysis subsystem may be configured to function as an element having a surface that is cooled such that molecules in the vacuum chamber are adsorbed onto the surface. In one such embodiment, which is shown in FIG. 5, element 46 may be configured as a field terminator of the analysis subsystem. A field terminator is not technically a part of an electron column. Instead, the electron column terminates at the last lens, and the field terminator is positioned around this lens. The field terminator may be coupled to the electron column to maintain the position of the field terminator with respect to the electron column. The field terminator generally functions to smooth the electric field incident on the surface of the specimen. In this manner, the element may have multiple functions: field terminating and molecule adsorption.

Any other element that has a surface area suitable for adsorption of molecules and that performs a function that will not be altered by reconfiguration of the element for cooling may be reconfigured to function as an element as described further herein. For instance, although a field terminator may be advantageously reconfigured to adsorb molecules as described herein since it has a relatively large surface area (e.g., the field terminator may have a width of about 20 cm) that is substantially opposite to and above the surface of specimen 12, it is to be understood that any other element of the analysis subsystem or coupled to the analysis subsystem regardless of position within the vacuum chamber may be used to adsorb molecules as described further herein. The system shown in FIG. 5 may be further configured as described herein.

The embodiments described herein may use only one type of mechanism (e.g., a cooled surface) for substantially reducing alteration of a characteristic of a specimen. Using only one type of mechanism may be advantageous in that it provides a relatively simple system. In addition, since the mechanisms described herein are effective for substantially eliminating carryover or other alteration of a specimen characteristic, the mechanisms may be implemented without other specimen pre-treatment mechanisms for removing unwanted molecules from the specimen prior to analysis. Since such pre-treatment may reduce the throughput of the analysis process, the embodiments described herein may have a relatively high throughput while substantially eliminating carryover or other alteration of a characteristic of the specimen.

However, it is to be understood that the systems described herein may include or use one or more additional mechanisms to assist in reducing alteration of a characteristic of a specimen. For example, the system may be configured to heat the specimen or to expose the specimen to a plasma or electromagnetic radiation (e.g., microwave, infrared, visible, or ultraviolet (UV) radiation) prior to or during the analysis performed by the system. In one such example, the system may include a heating element disposed in one or more stages of the system. The stages may include the stage configured to support the specimen in the load lock chamber and/or the stage configured to support the specimen in the analysis chamber. In another example, photon illumination (UV, visible, or infrared) of the entire specimen may be performed as a pre-treatment either in the analysis chamber or in the load lock chamber. Such pre-treatment may alternatively be performed only locally just at the analysis site or sites on the specimen. Any other appropriate plasma or electromagnetic radiation source known in the art may be included in the systems described herein.

In another example, the system may be configured to perform increased pumping in the load lock chamber. In a further example, the system may include a three chamber configuration that includes two load lock chambers in addition to the analysis chamber. Increasing the pumping in the load lock chamber or increasing the number of load lock chambers may reduce the number of molecules that are introduced to the analysis chamber from the load lock chamber thereby reducing the overall number of molecules adsorbed onto the cooled surface.

As described above, therefore, the system embodiments described herein may be used to substantially eliminate carryover or changes in dimensions of one or more structures formed on a specimen. However, the system embodiments described herein may also be advantageously used to reduce alteration of other characteristics of a specimen. For example, the characteristic of the specimen may include an amount of nitrogen contained within a structure formed on the specimen. In another example, the characteristic of the specimen may include an amount of oxygen contained within a structure formed on the specimen. In an additional example, the characteristic of the specimen may include an amount of nitrogen and oxygen contained within a structure formed on the specimen.

The embodiments described herein may, therefore, be used to improve the accuracy of nitrogen measurements. In addition, the embodiments described herein may be used to improve precision for both oxygen and nitrogen measurements.

In some embodiments, the characteristic of the specimen includes an amount of a material (e.g., one or more molecules, one or more compounds, and/or one or more elements) contained within the specimen. In such an embodiment, the material can participate in a surface or near surface charged particle catalyzed reaction with the molecules. Therefore, adsorbing the molecules onto a cooled surface as described further herein will reduce such reactions between the material in the specimen and the molecules.

As described above, the embodiments described herein may be used to remove molecules such as water molecules from a vacuum chamber during analysis of a specimen by adsorbing the molecules onto a cooled surface. Such reduction in the availability of water molecules for reactions with a specimen during exposure to an electron beam may reduce the removal of nitrogen from the specimen. For example, one possible mechanism of nitrogen removal from a specimen involving water molecules in the presence of an electron beam is illustrated in FIG. 6.

Figure 6:
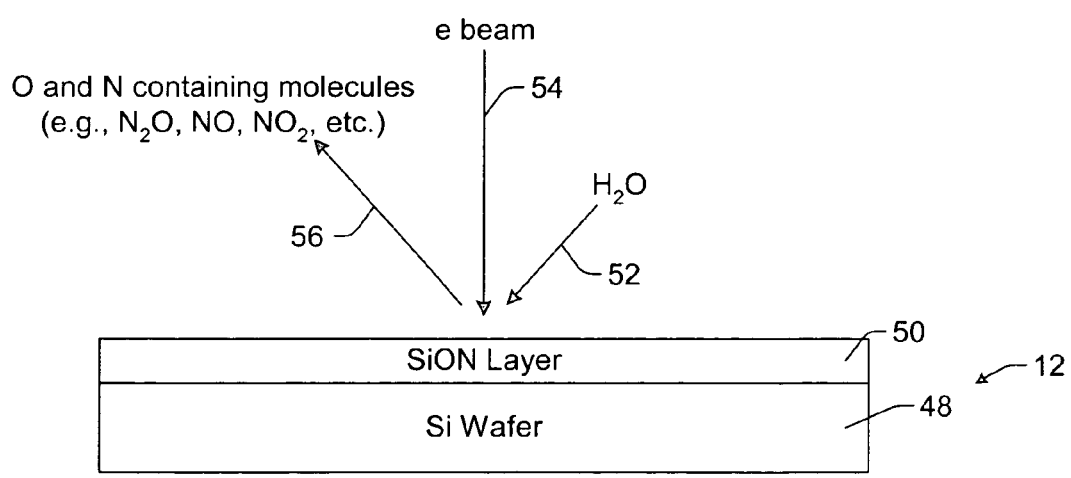
FIG. 6 is a schematic diagram illustrating a side view of one possible mechanism in which nitrogen may be removed from a specimen during exposure of the specimen to an electron beam in the presence of water molecules.

As shown in FIG. 6, specimen 12 may include silicon wafer 48 on which a nitrogen containing structure may be formed. For instance, silicon oxynitride (SiON) layer 50 may be formed on silicon wafer 48. SiON layer 50 may be a gate dielectric layer. If water molecules 52 are present in a vacuum chamber (not shown in FIG. 6) during analysis of specimen 12, during exposure of the specimen to electron beam (e beam) 54, the water molecules may react with the nitrogen in SiON layer 50 to form reaction byproducts 56. Reaction byproducts 56 may include oxygen (O) and nitrogen (N) containing molecules such as, but not limited to, $N_2O$, NO, $NO_2$, etc. Therefore, such reactions may reduce the amount of nitrogen in layer 50. As such, the reactions may reduce the accuracy of measurements of the nitrogen content of layer 50. In addition, even if measurements of the nitrogen content of layer 50 are not performed during analysis of specimen 12, if nitrogen containing structures are present on the specimen during other analysis, reactions such as those described above may result in undesirable changes to the nitrogen containing structures during analysis. Therefore, the embodiments described herein may be used to reduce undesirable changes to nitrogen-containing structures during any analysis performed by a charged particle beam tool.

Figure 7:
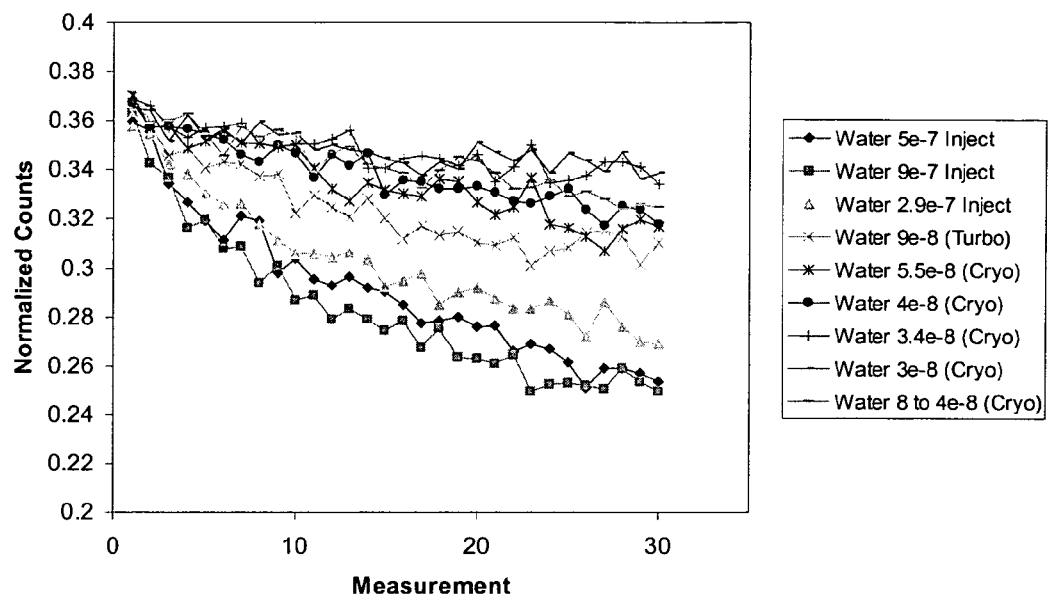
FIG. 7 is a plot illustrating nitrogen x-ray counts as a function of the number of measurements, which were performed in a vacuum chamber in which different amounts of water molecules were present, in which gases were removed by a turbo pump coupled to the vacuum chamber, or in which molecules were adsorbed by a cooled surface of an element disposed in the vacuum chamber.

Regardless of the mechanism by which nitrogen is removed from a specimen, FIG. 7 is a plot showing nitrogen x-ray counts as a function of the number of measurements. Measurements were performed in a vacuum chamber in which different amounts of water vapor were added to the vacuum chamber environment (e.g., measurements indicated as Water 5e-7 inject, Water 9e-7 Inject, and Water 2.9e-7 inject) while a turbo pump coupled to the vacuum chamber was running, but without removing gases by adsorbing molecules in the vacuum chamber onto a cooled surface of an element. Some of the measurements (e.g., measurements indicated by Water 9e-8 (Turbo)) were performed in a vacuum chamber, in which no external water vapor was added, and in which gases were removed by a turbo pump coupled to the vacuum chamber. Other measurements (e.g., measurements indicated by Water 5.5e-8 (Cryo), Water 4e-8 (Cryo), Water 3.4e-8 (Cryo), Water 3e-8 (Cryo), and Water 8 to 4e-8 (Cryo)) were performed in a vacuum chamber in which molecules were adsorbed by a cooled surface of an element (a cryogenically cooled panel) disposed in the vacuum chamber. The numbers listed after "Water" shown in FIG. 7 indicate the steady state partial pressure of water in the vacuum chamber during the experiment. The units of the partial pressure are Torr.

As shown in FIG. 7, without a cooled surface and with water injection, the normalized nitrogen counts decrease dramatically as the measurement number increases. In contrast, with turbo pumping but without water injection, and also without a cooled surface, the normalized nitrogen counts decrease as the measurement number increases, but much less dramatically than the normalized nitrogen counts without turbo pumping or a cooled surface. Such smaller changes in the normalized nitrogen counts may be attributed to the removal of water vapor in the vacuum chamber by the turbo pumping. In addition, using turbo pumping and a cooled surface, the normalized nitrogen counts decrease as the measurement number increases, but less than all of the other measurements. Therefore, using a cooled surface to adsorb water molecules in a vacuum chamber in which analysis of a specimen is performed as described further herein results in less change in the nitrogen measurements over time. Such relative stability in the nitrogen measurements may be attributed to the increased removal of water molecules from the vacuum chamber by adsorption of water molecules onto the cooled surface.

The measurements shown in FIG. 7, therefore, illustrate that deterioration of the signal is increased when the water partial pressure in the vacuum chamber is increased. In other words, as the water partial pressure in the vacuum chamber increases (resulting in a "wetter" environment), the normalized nitrogen counts show increased changes across time. In contrast, as the water partial pressure in the vacuum chamber decreases (resulting in a "drier" environment), the normalized nitrogen counts show decreased changes across time. As such, the embodiments described herein increase the accuracy of nitrogen measurements performed on a specimen. Furthermore, using a cooled surface to adsorb molecules in a vacuum chamber in which nitrogen measurements using an electron beam micro analysis (EPMA) system is one of the most effective techniques for making nitrogen dose measurements within the desired precision specifications for such measurements.

Figure 8:
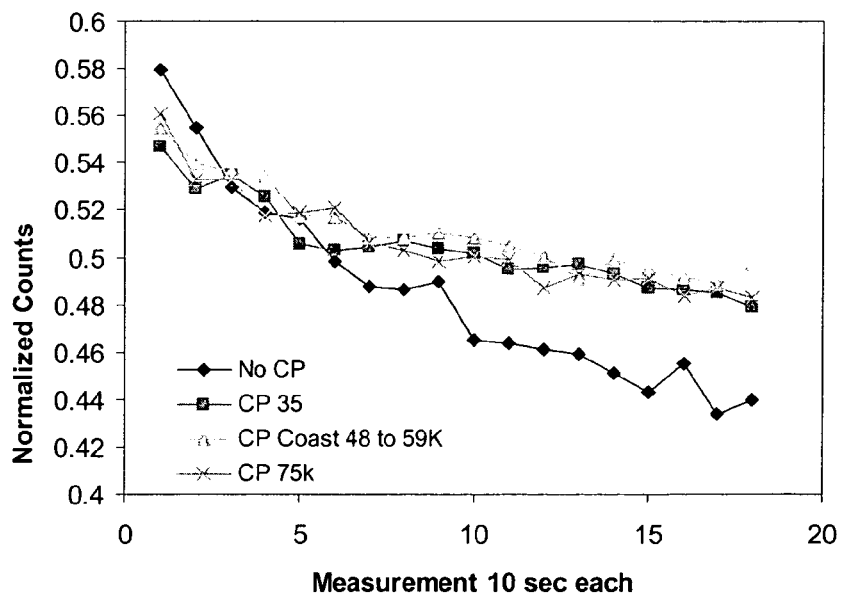
FIG. 8 is a plot illustrating nitrogen x-ray counts as a function of the number of measurements, which were performed in a vacuum chamber in which molecules were or were not adsorbed by a cooled surface of an element disposed in the vacuum chamber.

FIG. 8 illustrates additional nitrogen x-ray count measurements as a function of the number of measurements. The measurements shown in FIG. 8 were performed in a vacuum chamber in which molecules were or were not adsorbed by a cooled surface of an element disposed in the vacuum chamber. In particular, the measurements indicated as No CP are measurements that were performed without using a cooled surface to adsorb molecules in the vacuum chamber. However, turbo pumping was used to remove gases from the vacuum chamber before and during these measurements. CP 35 indicates measurements that were performed using a cooled surface maintained at a temperature of about 35 K during the analysis to adsorb molecules in the vacuum chamber. CP Coast 48 to 59K indicates measurements that were performed using a cooled surface to adsorb molecules in the vacuum chamber, but the cooled surface was not cooled during the analysis. Instead, a cooling subsystem coupled to the cooled surface was turned off during the analysis thereby allowing the temperature of the cooled surface to vary between about 48 K and about 59 K. CP 75k indicates measurements that were performed using a cooled surface maintained at a temperature of about 75 K during the analysis to adsorb molecules in the vacuum chamber. Turbo pumping for gas removal was used before and during all of the measurements that were performed using a cooled surface for molecule adsorption.

As shown in FIG. 8, the measurements that were performed without using a cooled surface to adsorb molecules showed the greatest change in normalized nitrogen counts across time. In addition, as shown in FIG. 8, the measurements that were performed using a cooled surface to adsorb molecules showed a much lower change in the normalized nitrogen counts as the measurement number increases. Each measurement was performed in about 10 seconds. Therefore, the normalized nitrogen counts decrease much less over time using a cooled surface to adsorb molecules than without using a cooled surface. Furthermore, the measurements that were performed in the presence of a cooled surface having a temperature that is maintained throughout analysis or allowed to vary during analysis, showed relatively similar changes across time. In addition, measurements performed in the presence of a cooled surface maintained at different temperatures (e.g., 35 K and 75 K) showed relatively similar changes across time. Therefore, the measurements will not vary substantially depending on the actual temperature of the cooled surface during the measurements as long as the cooled surface is at a temperature sufficient to at least partially solidify or crystallize water molecules to thereby cause adsorption of the molecules onto the cooled surface.

The water molecules that are adsorbed by the cooled surface may include molecules located on the specimen or within the vacuum chamber. As such, the embodiments described herein reduce changes in measurements of a characteristic of nitrogen in a specimen (or "nitrogen trending") by reducing moisture on the surface of the specimen and in a vacuum chamber in which the measurements are performed. In such embodiments, the temperature of the cooled surface may be between about 75 K and about 135 K during operation or analysis. In this manner, the temperature of the cooled surface may be greater than the temperature (up to about 60 K) that will cause condensation of nitrogen and oxygen onto the cooled surface. In addition, the temperature of the cooled surface may be less than the minimum temperature (135 K) for desorption of water from the cooled surface.

In some embodiments, therefore, the systems described herein may be configured to analyze a specimen by measuring an amount or other characteristic of nitrogen in the specimen. In one such embodiment, the analysis subsystem of the embodiments described herein may be configured as an analysis subsystem that may be included in an EPMA system. As such, the embodiments described herein may involve using cryogenic cooling to reduce trending in the nitrogen signal in applications such as EPMA. The embodiments described herein may also reduce signal trending for XPS or XFS measurements of nitrogen in gate layers. Any technique that involves electron impingement, generation, or direct or incidental electron ejection may exhibit similar nitrogen trending problems and may benefit from the embodiments described herein. In this manner, the system embodiments described herein provide increased accuracy for measurements of nitrogen in a specimen (reduction in nitrogen trending) by reduction in nitrogen removal from the specimen. The system embodiments described herein also provide increased precision for measurements of both nitrogen and oxygen in a specimen.

Such increased precision in nitrogen and oxygen measurements is illustrated in the measurements shown in Table 1. In particular, Table 1 illustrates the standard deviation of measurements of nitrogen and oxygen counts that are averaged over all measurement points across a whole wafer surface for successive loads of the specimen into the vacuum chamber. The measurements were performed in about 15 seconds.

TABLE 1

| Wafer, Signal | No CP | CP |
|---|---|---|
| RTNO N | 0.48 | 0.24 |
| RTNO O | 0.28 | 0.18 |
| DPN N | 0.48 | 0.35 |
| DPN O | 0.89 | 0.21 |

In Table 1, RTNO N indicates the 1 sigma value (percent standard deviation/average value) for a series of measurements using normalized nitrogen x-ray counts (counts/second*nanoamp of beam current) performed on a structure formed by a rapid thermal nitridation and oxidation (RTNO) process, which is commonly used to form gate layers. RTNO O indicates the 1 sigma for a series of normalized oxygen measurements performed on a structure formed by an RTNO process. DPN N indicates the 1 sigma for a series of normalized nitrogen measurements performed on a structure formed by a decoupled plasma nitration (DPN) gate fabrication process, which may be performed using the DPN tool that is commercially available from Applied Materials. In addition, DPN O indicates the 1 sigma for a series of normalized oxygen measurements performed on a structure formed by a DPN process.

In Table 1, NO CP indicates measurements that were performed without using a cooled surface to adsorb molecules in the vacuum chamber; CP indicates measurements that were performed using a cooled surface to adsorb molecules in the vacuum chamber.

As shown by the values in Table 1, all of the measurements that were performed using a cooled surface to adsorb molecules in the vacuum chamber showed a much lower 1 sigma value than the measurements that were performed without using a cooled surface to adsorb molecules in the vacuum chamber. Therefore, using a cooled surface to adsorb molecules in a vacuum chamber increases the precision of nitrogen and oxygen measurements.

As described above, the embodiments described herein may be configured to reduce the number of certain molecules that are present in a vacuum chamber by adsorbing them onto a cooled surface. In one such embodiment, the molecules may include water molecules thereby significantly reducing the water partial pressure inside the vacuum chamber. Such reduction in the water partial pressure may have a number of additional advantages. For example, by reducing the availability of water and oxygen in the vacuum chamber, the water and oxygen molecules in the electron column may also be reduced. Therefore, the amount of water and oxygen molecules in or proximate to the electron gun may also be reduced. As such, the availability of water and oxygen for attacking (etching) or reacting with the filament inside of an electron gun of the analysis subsystem will be reduced. In this manner, using a relatively large cryogenically cooled plate or other element described herein in an electron beam system may improve electron gun life. As a result, the embodiments described herein may be used to extend the lifetime of an electron gun of an analysis subsystem or other electron beam system such as an electron beam lithography system.

One embodiment, therefore, relates to a system configured to analyze a specimen that includes an analysis subsystem configured to analyze the specimen while the specimen is disposed in a vacuum chamber. The analysis subsystem includes a charged particle beam source. The charged particle beam source may include, for example, an electron gun. In addition, the system includes an element disposed within the vacuum chamber. A surface of the element is cooled such that molecules in the vacuum chamber are adsorbed onto the surface and cannot cause alteration of a characteristic of the charged particle beam source. This embodiment may be further configured as described herein.

As described above, therefore, the systems described herein are particularly advantageous for any analysis subsystem that uses an electron beam for the analysis of a specimen or any system in which derivation of a measurement involves the direct or incidental impingement or ejection of electrons or ions from the sample (XPS, AES, LEED, XFS, LEEM, etc.). These measurement techniques are substantially sensitive to the surface of the sample. Therefore, the reduction of contamination or inhibition of electron or ion catalyzed surface reactions(s) is desirable in such applications. In particular, as described further above, the presence of a cooled surface (e.g., a cryogenically cooled surface) in the vacuum chamber of an electron beam based tool inhibits any electron beam initiated reactions at the surface of the specimen, which involve the participation of a reactant present in the chamber environment. The reactant or reactants may originate either from the specimen or the system and may have a significant volatility at room temperature and a reduced volatility at the temperature of the cooled surface. Examples of such materials are water and organic contaminants (which resulted in carryover in the CD SEM and surface carbon buildup for SEM based inspections).

The systems described herein, however, would also be beneficial for FIB etch and/or deposition tools and electron beam etch and/or deposition tools. For example, the systems described herein may be used to inhibit, and even minimize, undesirable collateral reactions during deposition, which may significantly improve the quality of the deposited layers, particularly deposited conductive layers. For example, the conductivity of deposited interconnect lines is typically far lower than that of the pure metal. Such reduced conductivity may very well be due to incorporation of oxide (from water) and carbon based materials (from organic contaminants) into the deposited interconnect lines.

In one embodiment, therefore, a system configured to process a specimen includes a charged particle beam subsystem configured to catalyze a process performed on the specimen while the specimen is disposed in a vacuum chamber. The system also includes an element disposed within the vacuum chamber. A surface of the element is cooled such that molecules in the vacuum chamber are adsorbed onto the surface and cannot alter the process being performed at a surface of the specimen. In one embodiment, the charged particle beam subsystem is configured as a FIB tool. In a different embodiment, the charged particle beam subsystem is configured as an electron beam tool. In a further embodiment, the process includes deposition or etch. Each of the system embodiments described above may be further configured as described herein.

Examples of charged particle beam subsystems configured to catalyze a process performed on a specimen while the specimen is disposed in a vacuum chamber are illustrated in U.S. patent application Ser. No. 11/082,039 by Soltz et al., filed Mar. 15, 2005, which is incorporated by reference as if fully set forth herein. The systems described herein may be further configured as described in this patent application.

Accordingly, the systems described herein may be used in any application such as surface measurement, imaging, or any surface modification process in which reaction between water and/or organic materials is undesirable and the reduction of these materials from the interaction region on and near the sample surface is advantageous. In addition, the systems described herein may be used not only in vacuum or other low pressure chambers, but also in higher pressure chambers (i.e., non-vacuum chambers). As such, the systems described herein may be used as a highly efficient, low cost dessicant for use in chambers operated at any pressure. One such tool that may benefit from inclusion of a system described herein is an atomic force microscope (AFM) tool. Another such tool would be a scanning tunneling electron microscope (STM), or any other type of scanning probe imaging or measurement system, where surface reactions would distort the measurements being performed. The AFM and the STM may include any such microscopes known in the art.

In one embodiment, therefore, a system configured to analyze a specimen includes a scanning probe microscope configured to analyze the specimen while the specimen is disposed in an analysis chamber. The system also includes an element disposed within the analysis chamber. A surface of the element is cooled such that molecules in the analysis chamber are adsorbed onto the surface and cannot cause alteration of a characteristic of the specimen during the analysis. In one embodiment, the scanning probe microscope is configured as an AFM or a STM. Each of these embodiments of the system may be further configured as described herein.

Another embodiment relates to a method for reducing alteration of a specimen during analysis. The method includes creating a vacuum in a chamber in which the specimen is disposed during the analysis. The method also includes cooling a surface of an element disposed in the chamber to cause molecules in the chamber to be adsorbed onto the surface such that the molecules cannot cause alteration of a characteristic of the specimen during the analysis. The chamber in which the specimen is disposed may be configured as described further herein. In addition, the method may also be performed in a load lock chamber (e.g., the second of two load lock chambers into which the specimen is placed). The element may be configured as described further herein. In this manner, the method may be performed by any of the system embodiments described herein.

In one embodiment, cooling the surface of the element is not performed during the analysis. In another embodiment, cooling the surface of the element is performed during one or more pre-analysis functions that are performed while the specimen is in the chamber. In such an embodiment, cooling the surface of the element is not performed during the analysis. The cooling may be controlled as described further herein.

In one embodiment, the analysis includes inspection or metrology. In another embodiment, the characteristic of the specimen includes a dimension of structures formed on the specimen. In an additional embodiment, the characteristic of the specimen includes an amount of nitrogen contained within a structure formed on the specimen. In a further embodiment, the characteristic of the specimen includes an amount of oxygen contained within a structure formed on the specimen. In some embodiments the characteristic of the specimen includes an amount of nitrogen and an amount of oxygen contained within a structure formed on the specimen. In yet another embodiment, the analysis may include any surface based measurement in which removal of water and hydrocarbons or other potential reactants of an electron or ion catalyzed surface reaction during analysis will reduce surface reactions thereby improving the precision and/or accuracy of the measurement.

In one embodiment, a temperature of the specimen is not substantially altered by the cooling of the surface of the element. In some embodiments, the molecules include hydrocarbons, water vapor, or a combination thereof. Each of the embodiments of the method described above may include any other step(s) described herein.

Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or optical disk, or a magnetic tape.

In an embodiment, a processor may be configured to execute the program instructions to perform a computer-implemented method according to the above embodiments. The processor may be further configured as described herein. The processor may take various forms, including a personal computer system, mainframe computer system, workstation, network appliance, Internet appliance, or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Further modifications and alternative embodiments of various aspects of the invention may be apparent to those skilled in the art in view of this description. For example, systems and methods for reducing alteration of a specimen during analysis are lo provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to reduce alteration of a specimen during analysis, comprising:
   a vacuum chamber in which the specimen is disposed during the analysis; and
   an element disposed within the vacuum chamber, wherein a surface of the element is cooled such that molecules in the vacuum chamber are adsorbed onto the surface and cannot cause alteration of a characteristic of the specimen during the analysis, wherein the characteristic of the specimen, comprises an amount of a material contained within the specimen, wherein the material can participate in a surface or near surface charged particle catalyzed reaction with the molecules, wherein the surface of the element is cooled such that a temperature of the specimen is not substantially altered by the element, and wherein the system is further configured to control a cooling subsystem coupled to the element such that the surface of the element is not cooled during the analysis.

2. The system of claim 1, wherein the molecules comprise hydrocarbons, water vapor, or a combination thereof.

3. The system of claim 1, wherein the characteristic of the specimen further comprises a dimension of structures formed on the specimen.

4. The system of claim 1, wherein the characteristic of the specimen further comprises an amount of nitrogen, oxygen, or nitrogen and oxygen contained within a structure formed on the specimen, 5. The system of claim 1, wherein the element is further disposed along an inner surface of the vacuum chamber.

6. The system of claim 1, wherein the element is further disposed above the specimen.

7. A system configured to analyze a specimen, comprising:
   an analysis subsystem configured to analyze the specimen while the specimen is disposed in a vacuum chamber; and
   an element disposed within the vacuum chamber, wherein a surface of the element is cooled such that molecules in the vacuum chamber are adsorbed onto the surface and cannot cause alteration of a characteristic of the specimen during analysis, wherein the characteristic of the specimen comprises an amount of a material contained within the specimen, wherein the material can participate in a surface or near surface charged particle catalyzed reaction with the molecules, wherein the element is configured such that a temperature of the specimen is not substantially altered by the surface of the element, and wherein the system is further configured to control a cooling subsystem coupled to the element such that the surface of the element is not cooled during the analysis.

8. The system of claim 7, wherein the molecules comprise hydrocarbons, water vapor, or a combination thereof.

9. The system of claim 7, wherein the characteristic of the specimen further comprises a dimension of structures formed on the specimen.

10. The system of claim 7, wherein the characteristic of the specimen further comprises an amount of nitrogen, oxygen, or nitrogen and oxygen contained within a structure formed on the specimen.

11. The system of claim 7, wherein the analysis subsystem comprises a charged particle beam based subsystem.

12. The system of claim 7, wherein the analysis subsystem is further configured to analyze the specimen using a technique that involves direct or incidental electron or ion ejection.

13. The system of claim 7, wherein the analysis subsystem is further configured to analyze the specimen using incident x-rays.

14. The system of claim 7, wherein the analysis subsystem is further configured as an inspection subsystem, a metrology subsystem, or an inspection and metrology subsystem.

15. The system of claim 7, wherein the system is Her configured to control the cooling subsystem coupled to the element such that the surface of the element is cooled while the analysis subsystem is performing one or more pre-analysis functions.

16. The system of claim 7, wherein the element is further disposed along an inner surface of the vacuum chamber and outside of a measurement path of the analysis subsystem.

17. The system of claim 7, wherein the element is further disposed between the specimen and the analysis subsystem, and wherein the element is further configured such that a measurement path of the analysis subsystem passes through the element.

18. The system of claim 7, wherein the element is coupled to the analysis subsystem.

19. A method for reducing alteration of a specimen during analysis, comprising:
creating a vacuum in a chamber in which the specimen is disposed during the analysis; and
cooling a surface of an element disposed in the chamber to cause molecules in the chamber to be adsorbed onto the surface such that the molecules cannot cause alteration of a characteristic of the specimen during the analysis, wherein the characteristic of the specimen comprises an amount of a material contained within the specimen, wherein the material can participate in a surface or near surface charged particle catalyzed reaction with the molecules, wherein a temperature of the specimen is not substantially altered by said cooling, and wherein said cooling is not performed during the analysis.

20. The method of claim 19, wherein said cooling is performed during one or more pre-analysis functions performed while the specimen is in the chamber.

21. The method of claim 19, wherein the analysis comprises inspection or metrology.

22. The method of claim 19, wherein the characteristic of the specimen further comprises a dimension of structures formed on the specimen.

23. The method of claim 19, wherein the characteristic of the specimen further comprises an amount of nitrogen, oxygen, or nitrogen and oxygen contained within a structure formed on the specimen, 24. The method of claim 19, wherein the molecules comprise hydrocarbons, water vapor, or a combination thereof.

25. A system configured to analyze a specimen, comprising:
an analysis subsystem configured to analyze the specimen while the specimen is disposed in a vacuum chamber, wherein the analysis subsystem comprises a charged particle beam source; and
an element disposed within the vacuum chamber, wherein a surface of the element is cooled such that molecules in the vacuum chamber are adsorbed onto the surface and cannot cause alteration of a characteristic of the charged particle beam source or alteration of a characteristic of the specimen during analysis, wherein the characteristic of the specimen comprises an amount of a material contained within the specimen, wherein the material can participate in a surface or near surface charged particle catalyzed reaction with the molecules, wherein the surface of the element is cooled such that a temperature of the specimen is not substantially altered by the element, and wherein the system is further configured to control a cooling subsystem coupled to the element such that the surface of the element is not cooled during the analysis of the specimen.

26. A system configured to analyze a specimen, comprising:
a scanning probe microscope configured to analyze the specimen while the specimen is disposed in an analysis chamber; and
an element disposed within the analysis chamber, wherein a surface of the element is cooled such that molecules in the analysis chamber are adsorbed onto the surface and cannot cause alteration of a characteristic of the specimen during analysis of the specimen, wherein the characteristic of the specimen comprises an amount of a material contained within the specimen, wherein the material can participate in a surface or near surface charged particle catalyzed reaction with the molecules, wherein the surface of the element is cooled such that a temperature of the specimen is not substantially altered by the element, and wherein the system is further configured to control a cooling subsystem coupled to the element such that the surface of the element is not cooled during the analysis of the specimen.

27. The system of claim 26, wherein the scanning probe microscope is further configured as an atomic force microscope or a scanning tunneling electron microscope.

28. A system configured to process a specimen, comprising:
a charged particle beam subsystem configured to catalyze a process performed on the specimen while the specimen is disposed in a vacuum chamber; and
an element disposed within the vacuum chamber, wherein a surface of the element is cooled such that molecules in the vacuum chamber are adsorbed onto the surface and cannot alter the process being performed at a surface of the specimen by participating in a surface or near surface charged particle catalyzed reaction with a material contained within the specimen, wherein the surface of the element is cooled such that a temperature of the specimen is not substantially altered by the element, and wherein the system is further configured to control a cooling subsystem coupled to the element such that the surface of the element is not cooled during the process.

29. The system of claim 28, wherein the charged particle beam subsystem is further configured as a focused ion beam tool.

30. The system of claim 28, wherein the charged particle beam subsystem is further configured as an electron beam tool.

31. The system of claim 28, wherein the process comprises deposition or etch.

* * * * *